US009927497B2

(12) United States Patent
Reichenbach et al.

(10) Patent No.: US 9,927,497 B2
(45) Date of Patent: Mar. 27, 2018

(54) SENSOR APPARATUS, PRODUCTION METHOD FOR A SENSOR APPARATUS HAVING AT LEAST ONE MAGNETIC CORE AND METHOD FOR DETERMINING A FIELD STRENGTH OF A MAGNETIC FIELD IN AT LEAST ONE SPATIAL DIRECTION

(71) Applicant: Robert Bosch GmbH, Stuttgart (DE)

(72) Inventors: Frank Reichenbach, Wannweil (DE); Sevki Gencol, Kirchentellinsfurt (DE); Rainer Eckstein, Lichtenstein (DE); Christian Patak, Reutlingen (DE); Achim Breitling, Reutlingen (DE); Arne Dannenberg, Metzingen (DE); Frank Schatz, Kornwestheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/120,951

(22) PCT Filed: Dec. 22, 2014

(86) PCT No.: PCT/EP2014/078960
§ 371 (c)(1),
(2) Date: Aug. 23, 2016

(87) PCT Pub. No.: WO2015/128031
PCT Pub. Date: Sep. 3, 2015

(65) Prior Publication Data
US 2016/0363636 A1 Dec. 15, 2016

(30) Foreign Application Priority Data
Feb. 25, 2014 (DE) .................... 10 2014 203 317

(51) Int. Cl.
*G01R 33/04* (2006.01)
*G01R 33/00* (2006.01)

(52) U.S. Cl.
CPC .......... *G01R 33/04* (2013.01); *G01R 33/0011* (2013.01); *G01R 33/0052* (2013.01)

(58) Field of Classification Search
CPC ... G01R 33/04; G01R 33/011; G01R 33/0052
(Continued)

(56) References Cited
U.S. PATENT DOCUMENTS 6,670,809 B1    12/2003  Edelstein et al.
2012/0313638 A1 12/2012  Patak et al.
(Continued)

FOREIGN PATENT DOCUMENTS

DE   10 2009 047 624 A1   6/2011
DE   10 2011 005764       9/2012
FR   2 894 679             6/2007

OTHER PUBLICATIONS

International Search Report dated May 27, 2015, of the corresponding International Application PCT/EP2014/078960 filed Dec. 22, 2014, 2 pages.
(Continued)

*Primary Examiner* — Christopher Mahoney
(74) *Attorney, Agent, or Firm* — Norton Rose Fulbright US LLP; Gerard Messina

(57) ABSTRACT

A sensor apparatus having at least one magnet core, on at least one carrier surface, which encompasses at least one soft magnetic material and for which a respective longitudinal center plane, which is oriented perpendicularly to the carrier surface and divides the respective magnet core into two halves having an identical mass, is definable, at least one coil being on, around, and/or adjacent to the at least one magnet core, the at least one magnet core having in its interior
(Continued)

sub-regions by which an initiation of a magnetization reversal of the respective magnet core is targetedly locally controllable since a drive energy to be applied for propagation of a magnetic domain wall is elevated. Also described is a manufacturing method for a sensor apparatus having at least one magnet core, and a method for ascertaining a field strength of a magnetic field in at least one spatial direction.

13 Claims, 5 Drawing Sheets

(58) Field of Classification Search
USPC .......................................................... 324/253
See application file for complete search history.

(56) References Cited

U.S. PATENT DOCUMENTS

| | | | |
|---|---|---|---|
| 2013/0057272 A1* | 3/2013 | Lenhard ............... | G01R 15/185 324/252 |
| 2014/0077796 A1* | 3/2014 | Schatz ................. | G01R 15/148 324/244 |
| 2017/0175259 A1* | 6/2017 | Lee ......................... | C23C 16/06 |

OTHER PUBLICATIONS

Zorlu et al., "An Orthogonal Fluxgate-Type Magnetic Microsensor With Electroplated Permalloy Core", Sensors and Actuators A, Elsevier Sequoia S. A., vol. 135, No. 1, Mar. 28, 2007, XP005928244, pp. 43-49.

* cited by examiner

SENSOR APPARATUS, PRODUCTION METHOD FOR A SENSOR APPARATUS HAVING AT LEAST ONE MAGNETIC CORE AND METHOD FOR DETERMINING A FIELD STRENGTH OF A MAGNETIC FIELD IN AT LEAST ONE SPATIAL DIRECTION

FIELD OF THE INVENTION

The present invention relates to a sensor apparatus. The invention likewise relates to a manufacturing method for a sensor apparatus having at least one magnet core. The invention furthermore relates to a method for ascertaining a field strength of a magnetic field in at least one spatial direction.

BACKGROUND INFORMATION

Patent document, DE 10 2009 047 624 A1 discusses magnetic field sensors for measuring magnetic fields. The magnetic field sensors have at least one magnet core, made of a soft magnetic material, which extends along a longitudinal axis. The magnet cores discussed in DE 10 2009 047 624 A1 are configured axially symmetrically with regard to their respective longitudinal axis. The magnet cores can furthermore have curved surfaces, in particular rounded terminal segments, and/or projecting or tapered center segments.

SUMMARY OF THE INVENTION

The invention creates a sensor apparatus having the features described hereon; a manufacturing method for a sensor apparatus having at least one magnet core, having the features described herein; and a method for ascertaining a field strength of a magnetic field in at least one spatial direction, having the features described herein.

SUMMARY OF THE INVENTION

The invention implements lower-noise determination of a value to be measured with the sensor apparatus, for example of a field strength of a magnetic field in at least one spatial direction, by improving the magnetic homogeneity of the at least one magnet core used therefor (e.g. by modifying its geometry and/or by introducing at least one external material). For that purpose the invention creates magnet cores that have in their interior sub-regions by way of which an initiation of a magnetization reversal of the respective magnet core is targetedly locally controllable/triggerable. The sub-regions have an increased or reduced (magnetic) flux density as compared with adjoining neighboring sub-regions, so that a propagation/startup of magnetic domain walls is energetically favored at those regions. By way of the advantageous embodiment of the magnet cores according to the present invention, the magnetic flux occurring at their interior is "controllable" in such a way that a drive force/drive energy to be applied in order to propagate a magnetic domain wall is elevated. The result is that, for example, pinning effects (e.g. at defects) have less impact, which results in lower noise. The low noise achievable by way of the (improved) magnetic homogeneity of the respective magnet core does not require either an increased electricity consumption or energy consumption as compared with the existing art, or a longer measurement time.

Advantageously, a respective longitudinal center plane, which is oriented perpendicularly to the carrier surface and divides the respective magnet core into two halves having an identical mass, is definable for the at least one magnet core, the at least one magnet core being embodied with at least one opening in its interior, with an asymmetrical shape with reference to its longitudinal center plane, and/or with an asymmetrical magnetic homogeneity with reference to its longitudinal center plane. In all the cases described here, the respective magnet core has in its interior sub-regions by way of which an initiation of a magnetization reversal of the respective magnet core is more targetedly locally controllable/triggerable. All the embodiments described here thus implement an increase in the drive force/drive energy to be applied in order to propagate a magnetic domain wall.

In an advantageous embodiment of the sensor apparatus, the at least one magnet core having the at least one opening in its interior is embodied symmetrically with reference to its longitudinal center plane and/or asymmetrically with reference to its transverse center plane proceeding perpendicularly to its longitudinal center plane and to its carrier surface and dividing the respective magnet core into two further halves having an identical mass. This core geometry implements an ingenious steering of the magnetic flux in the interior of the magnet core, which significantly reduces the noise, occurring upon use of the magnet core in the sensor apparatus, that affects the values measured by way of the sensor apparatus.

As an alternative thereto, the at least one magnet core having the at least one opening in its interior can be embodied asymmetrically with reference to its longitudinal center plane and/or centrically symmetrically with reference to its center point. The advantages described in the previous paragraph can also be ensured by way of this type of embodiment of the at least one magnet core.

In a further advantageous embodiment the at least one magnet core having the asymmetrical shape with reference to its longitudinal center plane is embodied with at least one projecting segment and/or with at least one recessed segment on at least one outer surface of the respective magnet core. As will be discussed in further detail below, at the at least one projecting segment and/or at the at least one recessed segment sub-regions respectively occur in which the magnetic flux is increased or reduced as compared with the magnetic flux present in their immediate surroundings. This promotes the propagation of a domain in the interior of the respective magnet core in accordance with a reproducible propagation pattern, and thus results in more-targeted triggering of the magnetization reversal of the magnet core.

For example, the at least one magnet core having the asymmetrical shape with reference to its longitudinal center plane can be embodied symmetrically with reference to its transverse center plane. As an alternative thereto, however, the at least one magnet core having the asymmetrical shape with reference to its longitudinal center plane can also be embodied centrically symmetrically with reference to its center point. Both embodiments make possible the advantageous sub-regions by way of which the magnetization reversal of the respective magnet core is triggerable in more targeted fashion.

In a further advantageous embodiment the at least one magnet core having the asymmetrical magnetic homogeneity with reference to its longitudinal center plane also encompasses at least one saturation-magnetization-lowering material in addition to the soft magnetic material. The at least one saturation-magnetization-lowering material can be, for example, silicon dioxide and/or silicon nitride. Inexpensive and easily processable materials can thus be used in order to implement the embodiment described here.

As an alternative or a supplement, the at least one magnet core having the asymmetrical magnetic homogeneity with reference to its longitudinal center plane can also encompass at least one saturation-magnetization-increasing material in addition to the soft magnetic material. In this case as well, a plurality of inexpensive and easily processable materials are usable for the at least one saturation-magnetization-increasing material. In this embodiment as well, the at least one magnet core can thus be manufactured easily and inexpensively.

The at least one magnet core having the asymmetrical magnetic homogeneity with reference to its longitudinal center plane also may have an asymmetrical magnetic homogeneity with reference to its transverse center plane and/or a centrically symmetrical magnetic homogeneity with reference to its center point. This ensures wide design latitude for embodying the at least one magnet core.

The sensor apparatus may be a magnetometer component, a magnetometer, a compass component, or a compass. The sensor apparatus is thus usable in versatile fashion. Be it noted, however, that the range of embodiment of the sensor apparatus is not limited to the examples listed here.

The corresponding manufacturing method for a sensor apparatus having at least one magnet core also ensures the advantages described above. The manufacturing method can be refined in accordance with the above-described embodiments of the sensor apparatus.

Execution of the corresponding method for ascertaining a field strength of a magnetic field in at least one spatial direction furthermore also achieves the above-described advantages. The method for ascertaining a field strength of a magnetic field in at least one spatial direction can also be refined in accordance with the above-described embodiments of the sensor apparatus.

Further features and advantages of the present invention are explained below with reference to the Figures.

DETAILED DESCRIPTION

Figure 1:
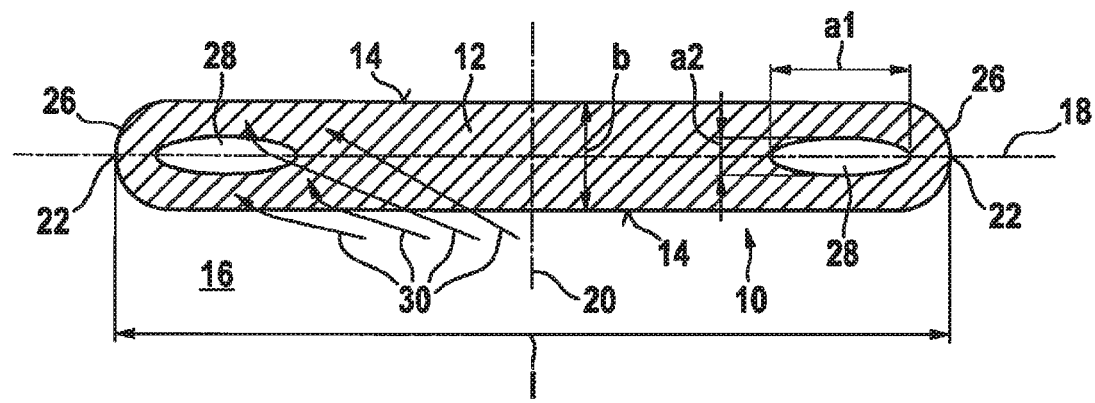
FIGS. 1 to 11 are schematic cross sections through sub-regions of embodiments of the sensor apparatus.

FIGS. 1 to 11 are schematic cross sections through sub-regions of embodiments of the sensor apparatus.

The sensor apparatuses schematically reproduced by way of FIGS. 1 to 11 each have at least one magnet core 10. The at least one magnet core 10 of each sensor apparatus encompasses at least one soft magnetic material 12. The at least one soft magnetic material 12 can be, for example, NiFe. Be it noted, however, that a plurality of materials are usable as the at least one soft magnetic material 12. Each magnet core 10 also has at least one outer surface 14. (The "at least one outer surface 14" is to be understood as at least one externally directed boundary surface of the respective magnet core 10.)

FIGS. 1 to 11 each show cross sections through a magnet core 10 of the respective sensor apparatus. By way of example, the cross section extends parallel to a carrier surface 16 on which the respective magnet core 10 is disposed/embodied. (The at least one outer surface 14 thus contacts carrier surface 16 over at least a partial surface.) Carrier surface 16 can be, for example, a substrate surface, in particular a surface of a semiconductor substrate.

Be it noted that the depiction of only one magnet core 10 in FIGS. 1 to 11 does not limit the respective sensor apparatus to being equipped with only the one magnet core 10. Each of the sensor apparatuses schematically reproduced in FIGS. 1 to 11 can have at least two magnet cores 10.

For each magnet core 10 of FIGS. 1 to 11, a longitudinal center plane 18, which is oriented perpendicularly to carrier surface 16 and divides the respective magnet core 10 into two halves having an identical mass, is definable. In addition, for each of magnet cores 10 of FIGS. 1 to 11 a transverse center plane 20 proceeding perpendicularly to its longitudinal center plane 18 and to its carrier surface 16, and dividing the respective magnet core into two further halves having an identical mass, is definable. A planar area of longitudinal center plane 18 located within the at least one outer surface 14 of the respective magnet core 10 may be (appreciably) larger than a planar area of transverse center plane 20 located inside the at least one outer surface 14 of the respective magnet core 10.

Two end points 22, which are located the farthest of all mass points of magnet core 10 from transverse center plane 20 of the respective magnet core 10, are definable on the at least one outer surface 14 of the respective magnet core 10. In this case longitudinal center plane 18 of the respective magnet core 10 may proceed through the two end points 22 (e.g. FIG. 1). Alternatively, partial surfaces of the at least one outer surface 14 of the respective magnet core 10 can also be defined as two end surfaces 24, the mass points of the two end surfaces 24 being located the farthest of all the mass points of magnet core 10 from transverse center plane 20 of the respective magnet core 10. Advantageously, longitudinal center plane 18 then proceeds through the two end surfaces 24. In particular, the two end surfaces 24 can be intersected centeredly by longitudinal center plane 18 of the respective magnet core 10 (e.g. FIG. 3).

Figure 2:
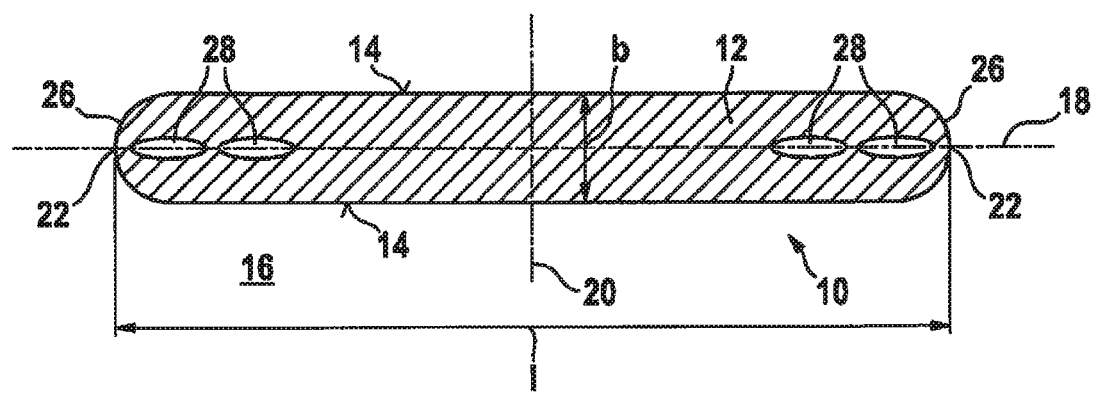

Usually two terminal segments 26, each having an end point 22 or an end surface 24, are embodied on each magnet core 10. In the embodiments of FIGS. 1, 2, 6, and 9 magnet cores 10 have rounded terminal segments 26. In the embodiments of FIGS. 1, 2, and 6 the respective magnet core 10 has, between the rounded terminal segments 26, a constant core width b perpendicular to its longitudinal center plane 18. The embodiments of FIGS. 3 to 5, 10, and 11, conversely, have a constant core width b (perpendicular to their longitudinal center planes 18) over their entire core length l (along longitudinal center plane 18), and have terminal segments 26 having edges.

For all the sensor apparatuses of FIGS. 1 to 11, at least one coil (not depicted) is disposed on, around, and/or adjacent to the at least one magnet core 10. The at least one coil may be disposed with respect to the at least one magnet core 10 associated with it in such a way that a magnetic field/alternating field is inducible by way of the at least one coil in the at least one associated magnet core 10, and/or an induced current/induced voltage is inducible in the at least one coil upon a change over time in the field/alternating field present in the at least one associated magnet core 10. The at least one coil can, for example, be disposed/embodied/wound on/around the at least one magnet core 10 in such a way that its windings proceed around longitudinal center plane 18 of magnet core 10 equipped therewith. The at least one coil can also be located adjacent to the at least one associated magnet core 10 in such a way that its windings proceed around a plane parallel to its longitudinal center plane 18. Options for utilizing the at least one coil are further discussed below.

For each sensor apparatus of FIGS. 1 to 11, the at least one magnet core 10 has in its interior sub-regions by way of which an initiation of a magnetization reversal of the respective magnet core 10 is targetedly locally controllable by the fact that a drive energy to be applied in order to propagate a magnetic domain wall is elevated. For this, the at least one magnet core 10 of FIGS. 1 to 11 is embodied with at least one opening 28 in its interior, with an asymmetrical shape with reference to its longitudinal center axis 18, and/or with an asymmetrical magnetic homogeneity with reference to its longitudinal center plane 18.

In the embodiments of FIGS. 1 to 6 the at least one magnet core 10 is embodied with the at least one opening 28 in its interior. By way of the at least one opening 28, it is possible to embody sub-regions in the interior of the respective magnet core 10 which exhibit an (appreciably) increased magnetic flux as compared with the adjoining neighboring sub-regions in the interior of the respective magnet core 10. This advantageous property is graphically depicted by way of example in FIG. 1. Arrows 30 that are depicted indicate some of the sub-regions implemented in magnet core 10 of FIG. 1 having an (appreciably) increased magnetic flux as compared with the adjoining neighboring sub-regions. The advantages of the sub-regions implemented in the interior of the respective magnet core 10 having the (appreciably) increased magnetic flux as compared with the adjoining neighboring sub-regions will be discussed below in further detail.

The "at least one opening 28" can be understood in particular as at least one cavity in the interior of the respective magnet core 10 which is detectable by way of a light microscope and/or an X-ray microscope. The at least one opening 28 can be embodied, for example, as an ellipsoid (FIGS. 1 and 2), as a crown shape (FIGS. 3 and 4), as a wedge (FIG. 5), as a pyramid (no example), as a sphere (FIG. 6), as a cuboid (no example), as a cube (no example), and/or as a polygon (no example). (A cross section, oriented parallel to carrier surface 16, of the at least one opening 28 can correspondingly be elliptical, crown-shaped, triangular, round, quadrangular, and/or square.) The shape of the at least one opening 28 is, however, freely selectable.

The at least one opening 28 may be located in at least one of the two terminal segments 26 (spaced away from transverse center plane 20) of the respective magnet core 10. The at least one opening can also, however, be embodied close to transverse center plane 20 of the respective magnet core 10. In particular, longitudinal center plane 18 and/or transverse center plane 20 can proceed through the at least one opening 28.

Figure 3:
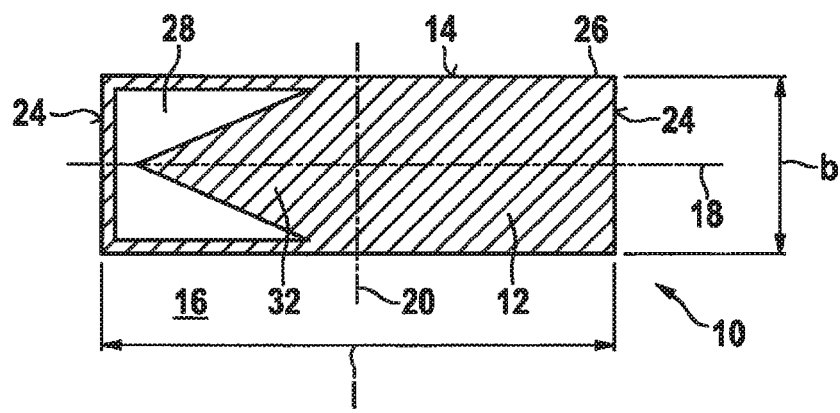
Figure 4:
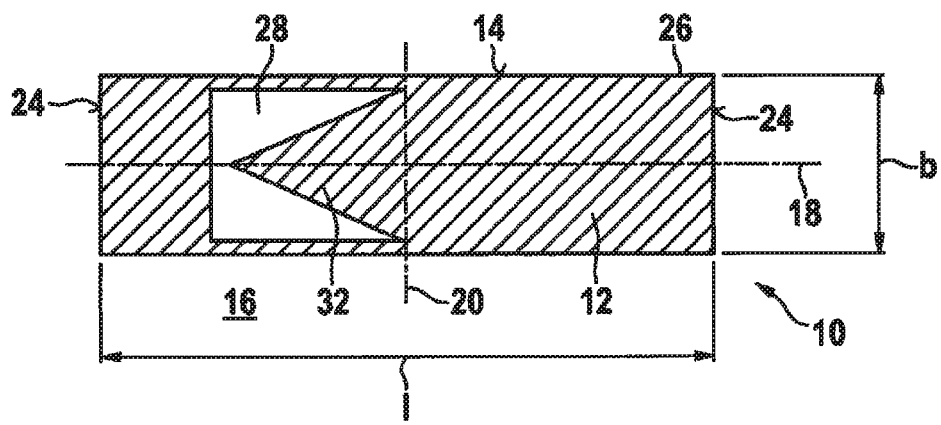
Figure 5:
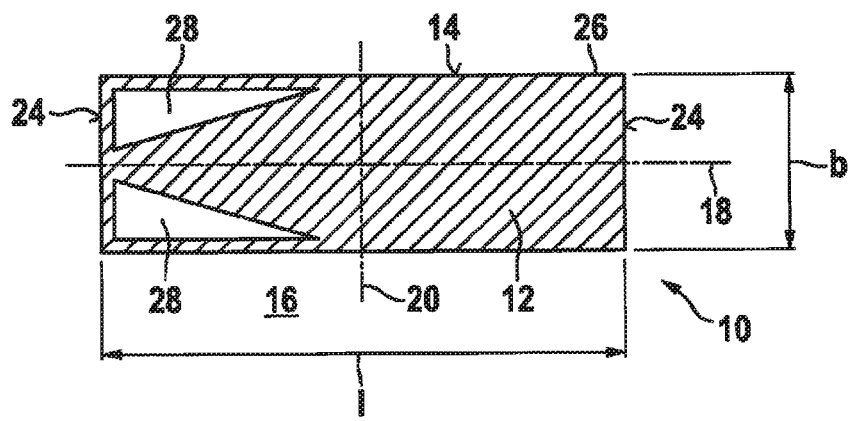
Figure 6:
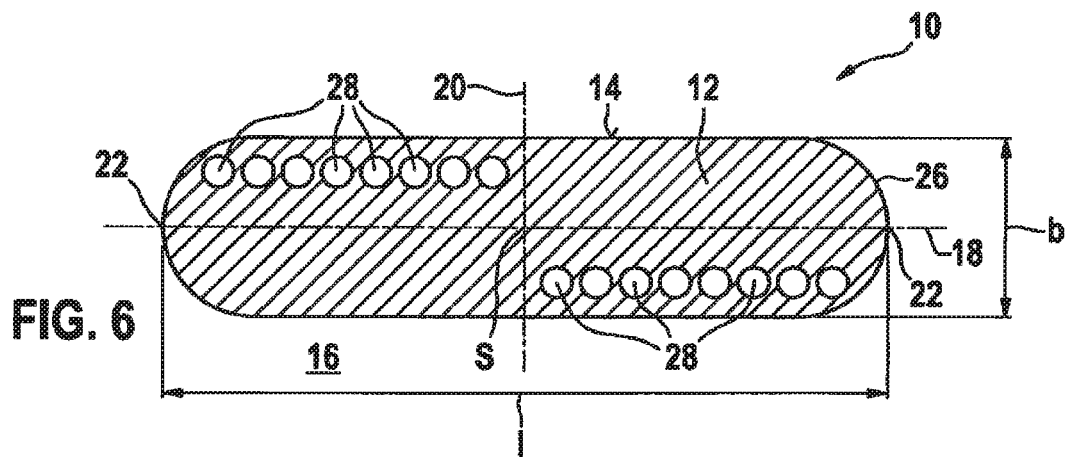

Each of magnet cores 10 of FIGS. 1 to 5 is embodied symmetrically/mirror-symmetrically with reference to its longitudinal center plane 18. In the embodiments of FIGS. 1 and 2, magnet core 10 is additionally embodied symmetrically/mirror-symmetrically with reference to its transverse center plane 20. In the embodiments of FIGS. 3 to 5, each magnet core 10 is embodied asymmetrically with reference to its transverse center plane 20.

In the embodiment of FIG. 1, one elliptical opening 28 is embodied in each of the two terminal segments 26. A longitudinal dimension a1, oriented parallel to longitudinal center plane 18, of the respective opening 28 is equal, for example, to one-sixth of the core length l. (The longitudinal dimension a1 of the at least one opening 28 may be selected so that it has little influence on a total mass of magnet core 10 and is nevertheless sufficient for the desired elevation of the magnetic flux adjacent to the at least one opening 28.) A transverse dimension a2, oriented parallel to transverse center plane 20, of the respective opening 28 is about one-third of the core width b. This produces a concentration of/increase in the magnetic flux present in the interior of magnet core 10 by a factor of 12 pprox. 3/2 adjacent to opening 28. A desired increase in the magnetic flux adjacent to the respective opening 28 can thus be defined by way of the longitudinal dimension a1 and the transverse dimension a2 of the at least one opening 28.

FIG. 2 shows a magnet core 10 having two openings 28 in each of the two terminal segments 26. An increase in the number of openings 28 makes possible a reduction in the longitudinal dimension a1 and transverse dimension a2 of the at least one opening 28 while maintaining the desired increase in the magnetic flux adjacent to the respective opening 28.

The (single) opening 28 in the interior of each magnet core 10 of the embodiments of FIGS. 3 and 4 has the shape of a (two-pointed) crown. For this, a protrusion 32 that tapers (away from transverse center plane 20) extends along longitudinal center plane 18 into the respective opening 28. In the embodiments of FIGS. 3 and 4, a concentration of/increase in the magnetic flux occurs at the tip of protrusion 32. By way of example, protrusion 32 has an internal angle of 30° at its tip projecting into the adjacent opening 28. Protrusion 32 can, however, also have a different internal angle at its tip.

In the embodiment of FIG. 3, opening 28 is embodied sufficiently close to an end surface 24 that the material located between opening 28 and the adjacent end surface 24 has a comparatively small layer thickness (along longitudinal center plane 18). In the embodiment of FIG. 4, conversely, opening 28 is spaced farther away from the closest end surface 24, with the result that a layer thickness (along longitudinal center plane 18) of the material located between the closest end surface 24 and opening 28 is increased.

In the embodiment of FIG. 5, two wedge-shaped openings 28 are embodied in only one terminal segment 26, while the other terminal segment 26 is present without an opening. The tips of the two wedge-shaped openings 28 are oriented toward transverse center plane 20. The boundary surfaces of the two wedge-shaped openings 28 may be oriented parallel to the at least one adjacent outer surface 14. The boundary surfaces, oriented toward longitudinal center plane 18, of the two wedge-shaped openings 28 can be located at an inclination angle of 30° with respect to longitudinal center plane 18.

The embodiment of FIG. 6 has a magnet core 10 that is embodied asymmetrically with reference to its longitudinal center plane 18. Magnet core 10 of FIG. 6, however, is embodied centrically symmetrically with reference to its center point S. Magnet core 10 depicted in FIG. 6 has two rows of spherical openings 28 that are each embodied with an offset from longitudinal center plane 18 in the interior of magnet core 10. A first of the two rows extends on a first side of transverse center plane 20 from transverse center plane 20 to terminal segment 26, located on that side, of magnet core 10. The second of the two rows proceeds correspondingly on another side of transverse center plane 20 from transverse center plane 20 to terminal segment 26, located on that side, of magnet core 10. The magnetic flux can be locally increased/reduced by way of the rows of openings 28 as well.

Figure 7:
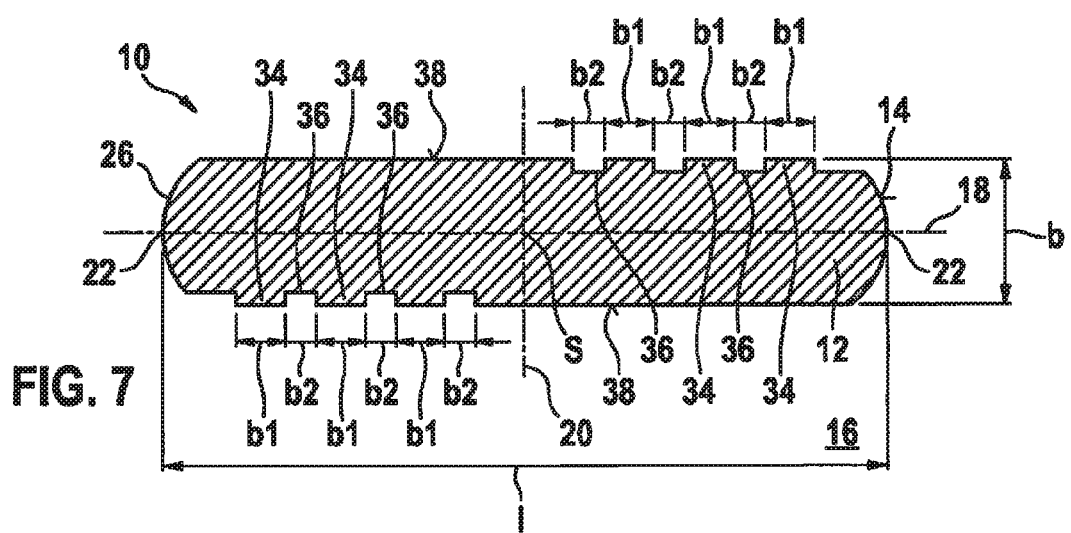
Figure 8:
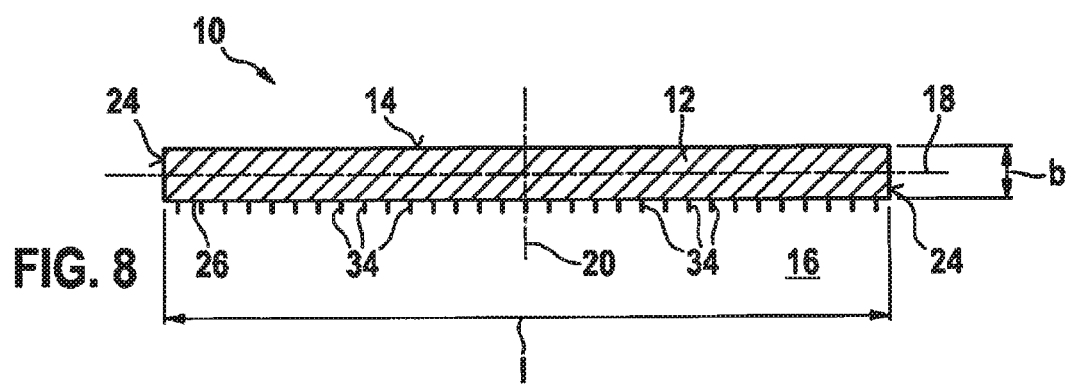
Figure 9:
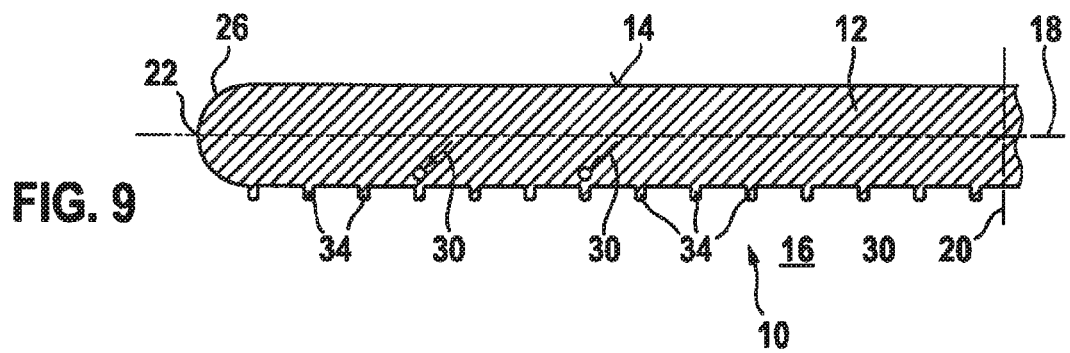

In the embodiments of FIGS. 7 to 9, the at least one magnet core 10 having the asymmetrical shape with reference to its longitudinal center plane 18 is embodied with at least one projecting segment 34 and/or with at least one recessed segment 36 on the at least one outer surface 14. By way of the at least one projecting segment 34, it is possible to embody sub-regions in the interior of the respective magnet core 10 which exhibit an (appreciably) reduced magnetic flux as compared with the adjoining neighboring sub-regions in the interior of the respective magnet core 10. Conversely, by way of the at least one recessed segment 36 it is possible to ensure that the respective magnet core 10 exhibits in its interior sub-regions that exhibit an (appreciably) increased magnetic flux as compared with the adjoining neighboring sub-regions in the interior of the respective magnet core 10.

For a core length l of between 500 µm and 2000 µm and a core width b between 10 µm and 50 µm, segments 34 and 36 can have, for example, at least one longitudinal dimension of between 1 µm and 15 µm parallel to longitudinal center plane 18, and/or a transverse dimension of between 1 µm and 10 µm parallel to transverse center plane 20. Be it noted, however, that the numerical values recited here are to be interpreted merely as examples. The at least one longitudinal dimension of segments 34 and 36 may be greater than the at least one transverse dimension of segments 34 and 36.

Segments 34 and 36 can be embodied only on the at least one outer surface 14 of a sub-region of magnet core 10; the sub-region having segments 34 and 36 can have a dimension parallel to longitudinal center plane 18 of between a tenth and three-quarters of the core length l of magnet core 10. In addition to segments 34 and 36, magnet core 10 can also have on its outer surface 14 at least one smooth surface 38 and/or at least one bulge/angular protrusion having an appreciably smaller volume.

Segments 34 and 36 can also be embodied in the form of a grid. For example, the grid can have the same pitch as the conductor paths of the at least one coil embodied on the respective magnet core 10. (For a core length l of between 500 µm and 2000 µm and a core width b of between 10 µm and 50 µm, a pitch can be, for example, in a range between 5 µm and 20 µm.) In a context of microtechnological manufacturing, the edges of magnet core 10 can be disposed in a suitable form with respect to the respective conductor paths. It is advantageous if the conductor paths of the at least one coil embodied on the respective magnet core 10 completely cover the bulges of regions 34 and 36. It is thereby possible to ensure that the topology of magnet core 10 does not cause any shunts.

For example, the at least one projecting segment 34 can have edges/corners and/or can be embodied as a bulge. The at least one recessed segment 36 can correspondingly also have edges/corners and/or can be an indentation. Segments 34 and 36 can thus be embodied in the form of a wedge, of a rectangle, of a rounded rectangle, of a semicircle, of a semi-cylinder, and/or of a semi-ellipsoid.

In the case of magnet core 10 of FIG. 7, segments 34 and 36 are embodied with edges/corners. It is evident that the projecting segments 34 have, parallel to longitudinal center plane 18, a first longitudinal dimension b1 that is not equal to a second longitudinal dimension b2 of the recessed segments 36 parallel to longitudinal center plane 18. This is to be interpreted, however, merely as exemplifying.

In the embodiment of FIG. 7, segments 34 and 36 are embodied on both sides of longitudinal center plane 18. A smooth/offset-free surface 38 is located on a second side of longitudinal center plane 18, mirror-reflected at longitudinal center plane 18, opposite segments 34 and 36 embodied on a first side of longitudinal center plane 38. A smooth/offset-free surface 38 is likewise correspondingly located on the first side of longitudinal center plane 18, mirror-reflected at longitudinal center plane 18, opposite segments 34 and 36 embodied on the second side of longitudinal center plane 18. In particular, magnet core 10 of FIG. 7 having the asymmetrical shape with reference to its longitudinal center plane 18 is embodied centrically symmetrically with reference to its center point S.

In the embodiment of FIG. 8, conversely, magnet core 10 having the asymmetrical shape with reference to its longitudinal center plane 18 is embodied symmetrically/mirror-symmetrically with reference to its transverse center plane 20. For this, segments 34 and 36 are embodied only on a first side of longitudinal center plane 18.

FIG. 9 is a partial cross section through a magnet core 10. As is evident from FIG. 9, projecting segments 34 on outer surface 14 of magnet core 10 are embodied only on a first side of longitudinal center plane 18. (Magnet core 10 of FIG. 9 is thus symmetrical/mirror-symmetrical with reference to its transverse center plane 20.) In particular, projecting segments 34 are shaped as bulges.

The magnetic flux density present in the interior of magnet core 10 of FIG. 9 increases proceeding from terminal segments 26 to transverse center plane 34. In addition, sub-regions having a lower magnetic flux density in comparison with the adjacent neighboring sub-regions are present adjacent to projecting segments 34. (The arrow tips of arrows 30 indicate these sub-regions.) Because of its asymmetrical shape, the local flux decrease in the magnetic flux present in the interior of magnet core 10 of FIG. 9 is asymmetrical with respect to longitudinal center plane 18. As will be described in more detail below, this promotes a domain wall movement on one side of longitudinal center plane 18.

Figure 10:
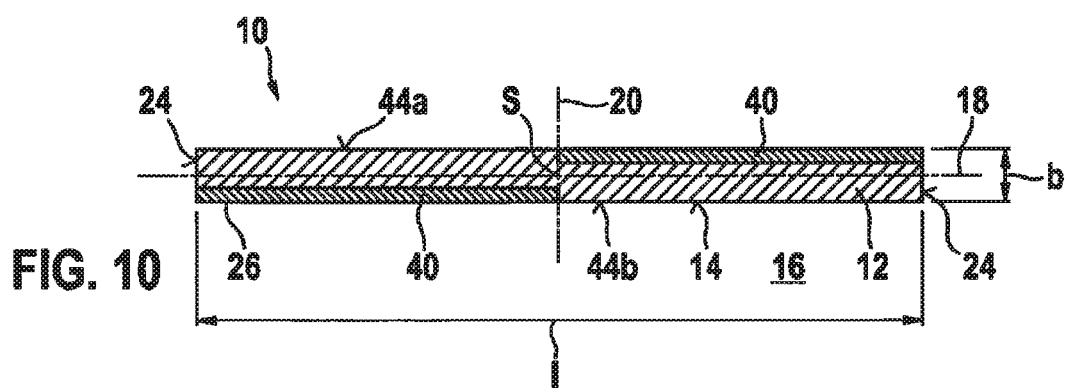
Figure 11:
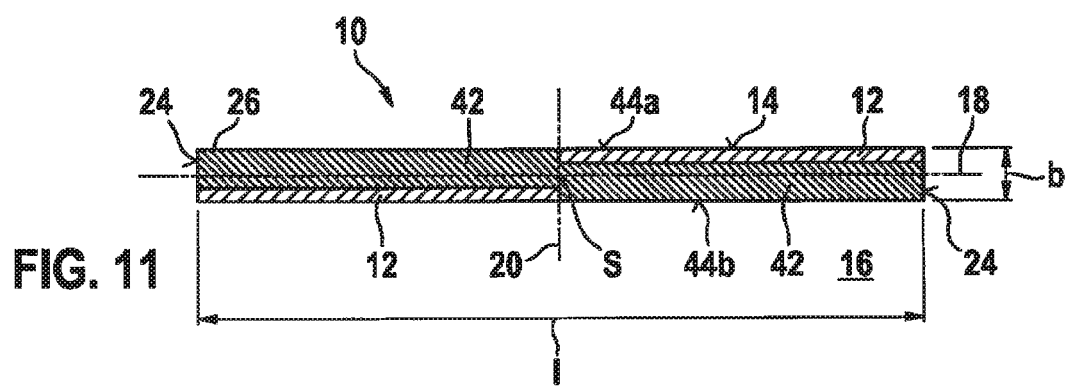

The embodiments of FIGS. 10 and 11 have a magnet core 10 having an asymmetrical magnetic homogeneity with reference to its longitudinal center plane 18. The asymmetrical magnetic homogeneity with reference to the longitudinal center plane is ensured by a corresponding asymmetry of the material distribution. For this, the respective magnet core 10 also encompasses at least one other material in addition to soft magnetic material 12. The at least one material also contained in the respective magnet core 10 in addition to soft magnetic material 12 can be at least one further soft magnetic material and/or at least one insulating material. A distribution of the at least one further soft magnetic material and/or of the at least one insulating material in the interior of the respective magnet core 10 may be asymmetrical with reference to its longitudinal center plane 18. The at least one further soft magnetic material and/or the at least one insulating material can also be paraphrased as at least one saturation-magnetization-lowering material 40 and/or as at least one saturation-magnetization-increasing material 42.

In the embodiments of FIGS. 10 and 11, magnet core 10 having the asymmetrical magnetic homogeneity with reference to its longitudinal center plane 18 also has an asymmetrical magnetic homogeneity with reference to its transverse center plane 20. In both embodiments, the magnetic homogeneity is also embodied centrically symmetrically with reference to center point S of the respective magnet core 10.

In the embodiment of FIG. 10 magnet core 10 also has at least one saturation-magnetization-lowering material 40 in addition to soft magnetic material 12. A plurality of insulating/nonmagnetic materials and/or soft magnetic materials can be used for the at least one saturation-magnetizationlowering material 40. For example, the at least one saturation-magnetization-lowering material can be silicon dioxide or silicon nitride.

In the embodiment of FIG. 11, magnet core 10 having the asymmetrical magnetic homogeneity with reference to its longitudinal center plane 18 also encompasses at least one saturation-magnetization-increasing material 42 in addition to soft magnetic material 12. Soft magnetic material 12 has, for example, a first value for its saturation magnetization, the at least one saturation-magnetization-increasing material 42 having, as a saturation magnetization, a second value greater than the first value. A plurality of inexpensive and easily processable materials can thus be used as the at least one saturation-magnetization-increasing material.

The at least one saturation-magnetization-lowering material 40 and/or the at least one saturation-magnetization-increasing material 42 can, for example, be diffused into soft magnetic material 12 on at least one partial surface of the at least one outer surface 14. In particular, the at least one saturation-magnetization-lowering material 40 and/or the at least one saturation-magnetization-increasing material 42 can be diffused into soft magnetic material 12 on at least one partial surface of at least one lateral surface 44a and 44b oriented parallel to longitudinal center plane 18 (and perpendicularly to carrier surface 16). By way of example, in the exemplifying embodiments of FIGS. 10 and 11, material 40 or 42 is diffused into soft magnetic material 12 through a first partial surface of a first lateral surface 44a located on a first side of longitudinal center plane 18, and through a second partial surface of a second lateral surface 44b located on a second side of longitudinal center plane 18. In particular, the first partial surface extends from transverse center plane 20 out to a first terminal segment 26, and the second partial surface extends from transverse center plane 20 out to a second terminal segment 26.

A depth to which material 40 or 42 diffuses in can be, for example, between one-tenth and nine-tenths of the core width b.

All the above-described embodiments of FIGS. 1 to 11 can be embodied/usable as a magnetometer component, as a magnetometer, as a compass component, or as a compass. The sensor apparatuses of FIGS. 1 to 11 are thus usable for a plurality of utilization possibilities. The above-described sensor apparatuses can also be used in particular as flux gates. One measuring element having a respective magnet core 10 and at least one associated coil can be utilized for each magnetic field axis to be investigated/measured. Each of the above-described sensor apparatuses can thus have at least two magnet cores 10 whose respective longitudinal center planes 16 can be oriented tiltedly, in particular perpendicularly, to one another. In particular, each sensor apparatus can have three magnet cores 10 having mutually perpendicularly oriented longitudinal center planes 18.

Each of magnet cores 10 (each having at least one opening 28 in its interior, an asymmetrical shape with reference to its longitudinal center plane 18, and/or having an asymmetrical magnetic homogeneity with reference to its longitudinal center plane 18) has in its interior sub-regions that exhibit an increased or reduced magnetic flux as compared with the adjoining neighboring sub-regions in the interior of the respective magnet core 10. A propagation movement of magnetic domain walls which initiate a magnetization reversal of the respective magnet core 10 is thus energetically favored within the sub-regions (having the increased or reduced magnetic flux as compared with the adjoining neighboring sub-regions). (A magnetization reversal of magnet core 10 occurs via a displacement of the magnetic domain walls between the Weiss regions.) The sub-regions are therefore less stabilized (as compared with the adjoining neighboring sub-regions) with regard to magnetization reversal.

As a rule, a field strength of a magnetic field component which is oriented along a sensitive axis of magnet core 10 is ascertained by way of a magnet core 10 (and its at least one associated coil). The sensitive axis of magnet core 10 is located almost exclusively inside longitudinal center plane 18. In order to determine the field strength it is usual to use magnet cores 10 whose crystal anisotropy with respect to their respective longitudinal center plane 18 exists at an angle of 45°. The crystal anisotropy is thus also oriented with a tilt at an angle of 45° with respect to the sensitive axis of magnet core 10. The result of this, conventionally, is that during a (spontaneous) magnetization reversal, various flipover mechanisms having different domain wall movements (domain wall propagations) can occur. For example, the domain wall movement can be triggered symmetrically with respect to transverse center plane 20, but only on one side of longitudinal center plane 18. The domain wall movements can also proceed centrically symmetrically with respect to center point S. In this case the domain wall movement begins on both sides of longitudinal center plane 18. According to the existing art the crystal anisotropy of magnet core 10 therefore defines various initiation points for different domain wall movements (domain wall propagations). In the existing art, however, the variety of flipover mechanisms also causes elevated noise in the measured values ascertained for the field strength oriented along the sensitive axis.

Conversely, with each of magnet cores 10 of FIGS. 1 to 11 the embodiment of the sub-regions having the elevated or reduced magnetic flux as compared with the adjoining neighboring sub-regions in the interior of the respective magnet core 10 ensures that a propagation movement of domain walls begins in the sub-regions upon initiation of a magnetization reversal. This ensures that a single (dominating) flipover mechanism takes place with a high probability upon each magnetization reversal of the respective magnet core 10. The noise affecting the measured values determined for the field strength oriented along the sensitive axis is thereby reduced. More-reliable measured values for the field strength oriented along the sensitive axis can thus be ascertained by way of magnet cores 10 of FIGS. 1 to 11. In addition, pinning effects of the domain walls (e.g. at defects) have less of an impact with magnet cores 10 of FIGS. 1 to 11.

Figure 12:
FIG. 12 is a flow chart to explain an embodiment of the manufacturing method for a sensor apparatus having at least one magnet core.

FIG. 12 is a flow chart to explain an embodiment of the manufacturing method for a sensor apparatus having at least one magnet core.

The above-described embodiments of the sensor apparatus can be manufactured, for example, by way of the manufacturing method described hereinafter. Be it noted, however, that the range of embodiment of the manufacturing method is not limited to the manufacture of such a sensor apparatus.

In a method step S1, the at least one magnet core is embodied from at least one soft magnetic material on at least one associated carrier surface. A respective longitudinal center plane, which is oriented perpendicularly to the carrier surface and divides the respective magnet core into two halves having an identical mass, is definable for the at least one magnet core. Method step S1 is executed in such a way that the at least one magnet core is embodied with sub-regions in its interior, by which sub-regions an initiation of a magnetization reversal of the respective magnet core is targetedly locally controllable by the fact that a drive energy to be applied in order to propagate a magnetic domain wall is elevated. For this, the at least one magnet core is embodied with at least one opening in its interior, with an asymmetrical shape with reference to its longitudinal center plane, and/or with an asymmetrical magnetic homogeneity with reference to its longitudinal center plane. The at least one magnet core can be deposited, for example, as a thin layer on the at least one associated carrier surface. In method step S1, at least two magnet cores can also be deposited simultaneously or in at least two separate deposition operations (optionally with different orientations of the crystal anisotropy).

In a method step S2, at least one coil is disposed or embodied on, around, and/or adjacent to the at least one magnet core. The at least one coil can be manufactured, for example, by microtechnology.

The sensor apparatus manufactured by way of method steps S1 and S2 can be embodied as a magnetometer component, as a magnetometer, as a compass component, or as a compass. The sensor apparatus can be, in particular, a flux gate.

The numbering of the method steps S1 and S2 does not define any time-related sequence for execution thereof. The method steps S1 and S2 can thus be executed in any time sequence or simultaneously. The at least one coil can also be embodied in several sub-steps (as method step S2), the method step S1 being executable between two sub-steps.

Figure 13:
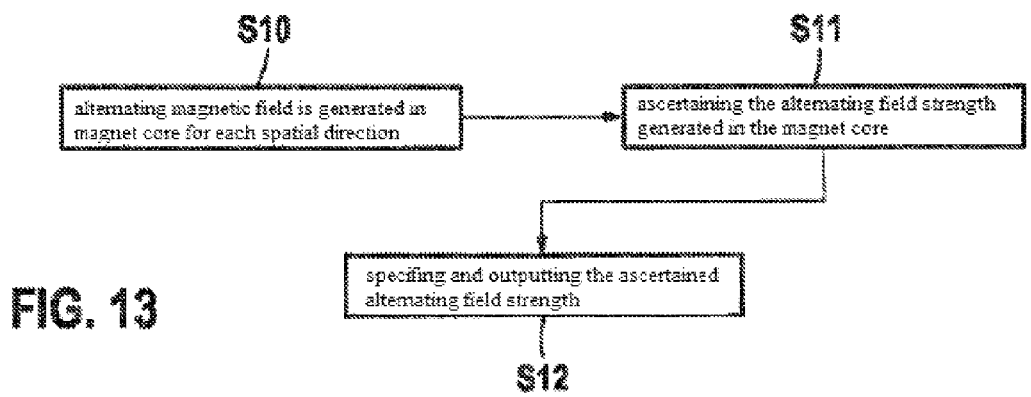
FIG. 13 is a flow chart to explain an embodiment of the method for ascertaining a field strength of a magnetic field in at least one spatial direction.

FIG. 13 is a flow chart to explain an embodiment of the method for ascertaining a field strength of a magnetic field in at least one spatial direction.

In a method step S10 an alternating magnetic field is generated in at least one magnet core for each spatial direction. The respective magnet core is embodied/shaped from at least one soft magnetic material on its associated carrier surface and has in its interior sub-regions by way of which an initiation of a magnetization reversal of the respective magnet core is targetedly locally controllable by the fact that a drive energy to be applied for propagation of a magnetic domain wall is elevated. This is ensured especially when the at least one magnet core exhibits at least one opening in its interior, an asymmetrical shape with reference to a longitudinal center plane oriented perpendicularly to carrier surface 16 and dividing the respective magnet core 10 into two halves having an identical mass, and/or an asymmetrical magnetic homogeneity with reference to the longitudinal center plane. The respective magnet core may be used for ascertaining the field strength in a spatial direction that lies within the longitudinal center plane. For example, in the method step S10 the alternating magnetic field can be generated in at least one of the magnet cores of FIGS. 1 to 11. The range of embodiment of the method step S10 is not limited, however, to the use of such a magnet core.

At least one first coil that is disposed on and/or adjacent to the at least one magnet core can be used to execute the method step S10. The windings of the at least one coil may proceed around the respective spatial direction for which the magnet core associated with it is being used. The at least one first coil can also be referred to as a "drive coil." In order to execute the method step S10, an alternating voltage can be applied to the at least one first coil. The result of this is that, in addition to an external magnetic field such as the earth's magnetic field, the generated alternating magnetic field is also present in the respective magnet core. If a superposition of the external magnetic field and the generated alternating magnetic field exceeds a predefined threshold value, this results in a spontaneous magnetization reversal of the magnet core.

In a method step S11 that is executed during generation of the alternating magnetic field (in the at least one magnet core for each spatial direction), an alternating field strength, generated during a magnetization reversal of the respective magnet core in the respective magnet core, of the alternating field in the respective spatial direction is ascertained. In order to ascertain the alternating field strength, generated in the respective magnet core, of the alternating field it is possible, for example, to detect in the method step S11 a point in time at which the spontaneous magnetization reversal of the magnet core takes place. At least one second coil that is disposed on and/or adjacent to the at least one magnet core can be used to detect the spontaneous magnetization reversal of the magnet core. The conductor paths of the at least one second coil also may proceed around the respective spatial direction for which the field strength of the magnetic field is to be ascertained. The at least one second coil can also be referred to as a "detection coil." It is possible to ascertain, by way of the point in time of the flipover, the voltage that is applied to the at least one first coil during the spontaneous magnetization reversal of the magnet core. From this value the alternating field strength, generated in the respective magnet core, of the alternating magnetic field can be derived.

In a method step S12 the ascertained alternating field strength is specified as the field strength of the magnetic field in the respective spatial direction, and outputted. The field strength of the magnetic field in the respective spatial direction is thus equal to the alternating field strength, generated in the respective magnet core, of the alternating field at the point in time of the spontaneous magnetization reversal of the magnet core.

What is claimed is:

1. A sensor apparatus, comprising:
   at least one magnet core, disposed on at least one carrier surface, which encompasses at least one soft magnetic material;
   at least one coil being disposed on, around, and/or adjacent to the at least one magnet core;
   wherein the at least one magnet core has sub-regions in its interior by which an initiation of a magnetization reversal of the respective magnet core is targetedly locally controllable since a drive energy to be applied for propagation of a magnetic domain wall is elevated,
   wherein a respective longitudinal center plane, which is oriented perpendicularly to the carrier surface and divides the respective magnet core into two halves having an identical mass, being definable for the at least one magnet core, and the at least one magnet core is embodied with at least one opening in its interior, with an asymmetrical shape with reference to its longitudinal center plane, and/or with an asymmetrical magnetic homogeneity with reference to its longitudinal center plane.

2. The sensor apparatus of claim 1, wherein the at least one magnet core having the at least one opening in its interior being embodied symmetrically with reference to its longitudinal center plane and/or asymmetrically with reference to its transverse center plane proceeding perpendicularly to its longitudinal center plane and to its carrier surface and dividing the respective magnet core into two further halves having an identical mass.

3. The sensor apparatus of claim 1, wherein the at least one magnet core having the at least one opening in its interior being embodied asymmetrically with reference to its longitudinal center plane and/or centrically symmetrically with reference to its center point.

4. The sensor apparatus of claim 1, wherein the at least one magnet core having the asymmetrical shape with reference to its longitudinal center plane is configured with at least one projecting segment and/or with at least one recessed segment on at least one outer surface of the respective magnet core.

5. The sensor apparatus of claim 4, wherein the at least one magnet core having the asymmetrical shape with reference to its longitudinal center plane is configured symmetrically with reference to its transverse center plane.

6. The sensor apparatus of claim 4, wherein the at least one magnet core having the asymmetrical shape with reference to its longitudinal center plane is configured centrically symmetrically with reference to its center point.

7. The sensor apparatus of claim 1, wherein the at least one magnet core having the asymmetrical magnetic homogeneity with reference to its longitudinal center plane also encompassing at least one saturation-magnetization-lowering material in addition to the soft magnetic material.

8. The sensor apparatus of claim 1, wherein the at least one magnet core having the asymmetrical magnetic homogeneity with reference to its longitudinal center plane also encompassing at least one saturation-magnetization-increasing material in addition to the soft magnetic material.

9. The sensor apparatus of claim 1, wherein the at least one magnet core having the asymmetrical magnetic homogeneity with reference to its longitudinal center plane also having an asymmetrical magnetic homogeneity with reference to its transverse center plane and/or a centrically symmetrical magnetic homogeneity with reference to its center point.

10. The sensor apparatus of claim 1, wherein the sensor apparatus includes one of a magnetometer component, a magnetometer, a compass component, and a compass.

11. A manufacturing method for a sensor apparatus having at least one magnet core, the method comprising:
configuring the at least one magnet core from at least one soft magnetic material on at least one associated carrier surface; and
disposing or configuring at least one coil on, around, and/or adjacent to the at least one magnet core;
wherein the at least one magnet core is configured with sub-regions in its interior, by which sub-regions an initiation of a magnetization reversal of the respective magnet core is targetedly locally controllable since a drive energy to be applied for propagation of a magnetic domain wall is elevated,
wherein the at least one magnet core is formed on the at least one associated carrier surface so that a respective longitudinal center plane, which is oriented perpendicularly to its carrier surface and divides the respective magnet core into two halves having an identical mass, is definable for the at least one magnet core, and the at least one magnet core is configured with at least one opening in its interior, with an asymmetrical shape with reference to its longitudinal center plane, and/or with an asymmetrical magnetic homogeneity with reference to its longitudinal center plane.

12. The manufacturing method of claim 11, wherein the sensor apparatus includes one of a magnetometer component, a magnetometer, a compass component, and a compass.

13. A method for ascertaining a field strength of a magnetic field in at least one spatial direction, the method comprising:
generating an alternating magnetic field in at least one magnet core made up of at least one soft magnetic material, on its associated carrier surface, for each spatial direction, the respective magnet core having in its interior sub-regions by which an initiation of a magnetization reversal of the respective magnet core is targetedly locally controllable since a drive energy to be applied for propagation of a magnetic domain wall is elevated; and
ascertaining, during generation of the alternating magnetic field, an alternating field strength, generated during a magnetization reversal of the respective magnet core in the respective magnet core, of the alternating field along the respective spatial direction, and the ascertained alternating field strength being specified as the field strength of the magnetic field in the respective spatial direction; and
outputting the ascertained alternating field strength,
wherein the at least one magnet core is formed on the at least one associated carrier surface so that a respective longitudinal center plane, which is oriented perpendicularly to its carrier surface and divides the respective magnet core into two halves having an identical mass, is definable for the at least one magnet core, and the at least one magnet core is configured with at least one opening in its interior, with an asymmetrical shape with reference to its longitudinal center plane, and/or with an asymmetrical magnetic homogeneity with reference to its longitudinal center plane.

* * * * *